(12) United States Patent
O'Donnell et al.

(10) Patent No.: US 8,136,007 B1
(45) Date of Patent: Mar. 13, 2012

(54) ADAPTIVE ERROR CORRECTION

(75) Inventors: Laura J. O'Donnell, El Segundo, CA (US); Hans M. Hagberg, Redondo Beach, CA (US); Michael A. Gorman, Lakewood, CA (US)

(73) Assignee: The DIRECTV Group, Inc., El Segundo, CA (US)

( * ) Notice: Subject to any disclaimer, the term of this patent is extended or adjusted under 35 U.S.C. 154(b) by 0 days.

(21) Appl. No.: 12/966,903

(22) Filed: Dec. 13, 2010

Related U.S. Application Data

(63) Continuation of application No. 10/993,656, filed on Nov. 19, 2004, now Pat. No. 7,861,132.

(51) Int. Cl.
*H03M 13/00* (2006.01)
(52) U.S. Cl. ......... 714/755; 714/746; 714/774; 714/776
(58) Field of Classification Search .................. 714/746, 714/755, 774, 776
See application file for complete search history.

(56) References Cited

U.S. PATENT DOCUMENTS

| | | | |
|---|---|---|---|
| 5,511,079 A * | 4/1996 | Dillon ........................ | 714/774 |
| 6,320,850 B1 * | 11/2001 | Perahia et al. ............. | 370/316 |
| 6,377,561 B1 * | 4/2002 | Black et al. ................ | 370/330 |
| 6,487,251 B1 * | 11/2002 | Antia et al. ................ | 375/259 |
| 6,574,794 B1 * | 6/2003 | Sarraf ........................ | 725/63 |
| 6,847,817 B2 * | 1/2005 | Hadinger et al. ........... | 455/430 |
| 2003/0112879 A1 * | 6/2003 | Antia et al. ................ | 375/259 |
| 2003/0182610 A1 * | 9/2003 | Bushmitch et al. ........ | 714/746 |

OTHER PUBLICATIONS

Campanella et al. Satallite and cable in the future marketplace and the role of MMIC, Jun. 1988, IEEE 1988 microwave and millimeter-wave monolithic circuits symposium. pp. 19-26.*

* cited by examiner

*Primary Examiner* — Sam Rizk

(57) ABSTRACT

A system and method for adaptive error correction that optimizes bandwidth by taking into account expected, or predicted, interferences. The bandwidth used for error correction is applied judiciously based on the value of the content and the need to receive the content the first time it is broadcast. The present invention further applies local optimizations in the case of spot-beam satellite broadcasts. As each spot corresponds to a particular geographic region, different input parameters may be used, thereby maximizing efficiency.

15 Claims, 2 Drawing Sheets

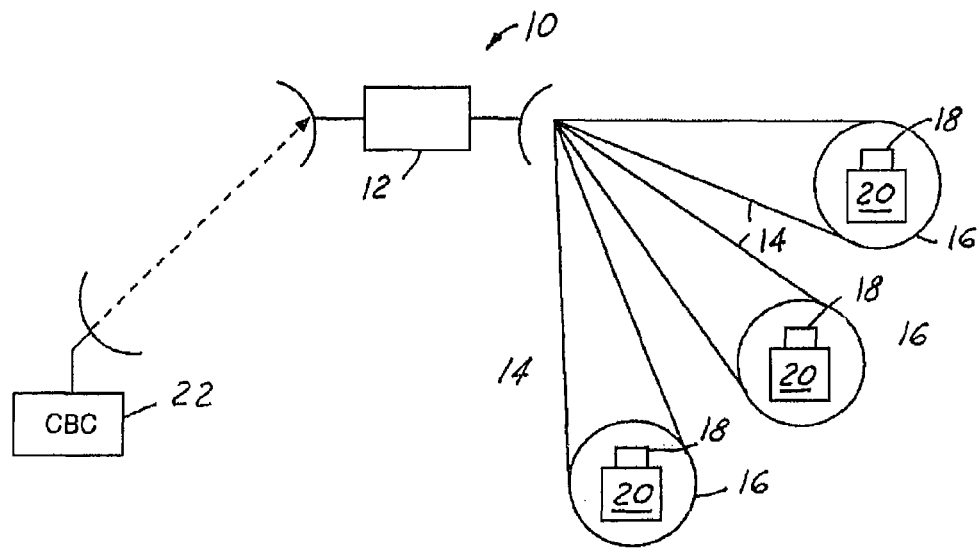
(Prior Art)
FIG. 1
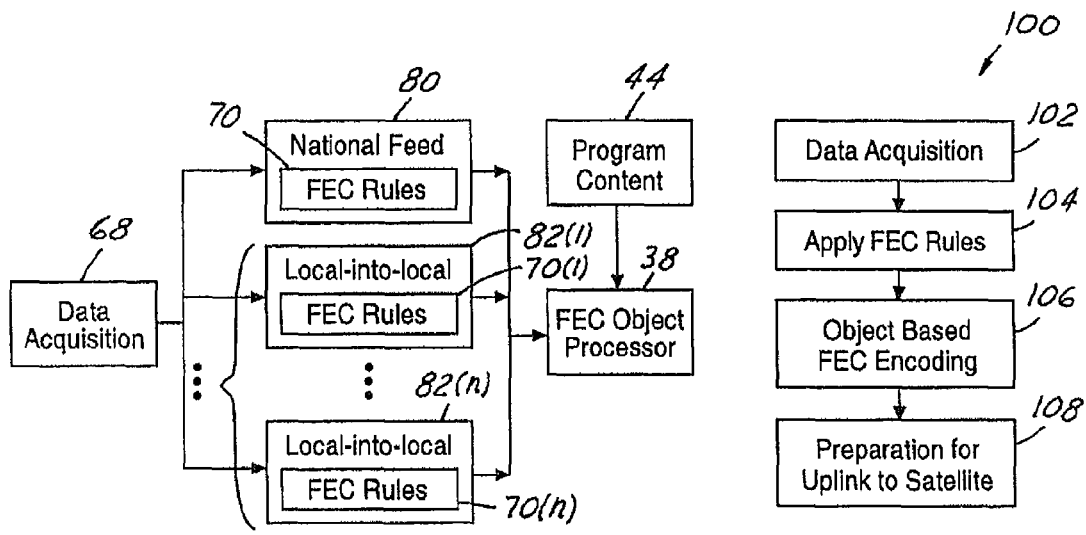
FIG. 3
FIG. 4

ADAPTIVE ERROR CORRECTION

TECHNICAL FIELD

The present invention relates generally to error correction of content broadcast over a satellite network and more particularly to adaptive error correction.

BACKGROUND OF THE INVENTION

Digital communications systems utilize communication channels over which data is transmitted. The communications channels typically have limited bandwidth and finite channel capacity. The channel capacity together with other properties of the channel, such as various forms of noise and interference, will, with statistical certainty, cause or otherwise result in the injection of error conditions in the traffic data communicated over the channel.

A technique for eliminating, or at least reducing, the effect of error conditions is called Forward Error Correction (FEC). In general, the employment of an FEC technique entails transmitting error detection data and error correction data along with the bearer data. The error detection and correction data are typically derived from the bearer data itself by employing an error detection algorithm and error correction algorithm known to the receiver as well as the transmitter.

Unfortunately, the transmission bandwidth available to a user transmitting in a particular time slot in known systems is reduced by the overhead required to transmit the error correction data. To further complicate the error correction process, the transmission bit rate is not fixed, but depends on dynamically varying conditions, such as the relative distance between a remote station and a central station, interference, environmental conditions, data transmission rate, and other conditions too numerous to mention herein.

As a result, the bit error rate of data transmitted between a central station and a remote station varies with each remote station and with time with respect to each remote station, making it difficult to systematically select an FEC error correction algorithm that optimizes both the transmission overhead and error protection capability. In the prior art, the error correction algorithm is typically selected based on a worst-case bit error rate, and is therefore overly robust for most situations, resulting in inefficient use of valuable bandwidth.

There is a need for error correction that can be optimized based on varying conditions, such as weather, the value of the content being transmitted, and local conditions for individual spot beams in a satellite broadcast.

SUMMARY OF THE INVENTION

The present invention is a method and system for adaptive error correction that optimizes bandwidth by taking into account expected, or predicted, interferences. The bandwidth used for error correction is applied judiciously based on the value of the content and the need to receive the content the first time it is broadcast. The present invention further applies local optimizations in the case of spot-beam satellite broadcasts. As each spot corresponds to a particular geographic region, different input parameters may be used, thereby maximizing efficiency.

According to the present invention, the broadcast system allows for services to provide a set of business rules for broadcast and client parameters. One such set of rules is the amount, if any, of Forward Error Correction (FEC) to be applied to data. For example, a high-value object that is broadcast more than once may increase the amount of FEC as it nears the end of the carousel cycle to improve the likelihood of reception. Also, the same object broadcast from different spot beams would use different rules to optimize for local conditions such as weather. The present invention has the capability of receiving feedback from dynamic sources of input, such as weather reports. The system utilizes this data to adapt the object broadcast in order to maximize the competing goals of bandwidth utilization and the probability of reception.

It is an object of the present invention to optimize bandwidth used for error correction by taking into account expected interferences. It is another object of the present invention to judiciously apply the bandwidth used for error correction based on the value of the content and the need to receive the content the first time it is broadcast. It is still another object of the present invention to apply local optimizations in the case of spot beam satellite broadcasts.

Other objects and advantages of the present invention will become apparent upon reading the following detailed description and appended claims, and upon reference to the accompanying drawings.

BRIEF DESCRIPTION OF THE DRAWINGS

For a more complete understanding of this invention, reference should now be had to the embodiments illustrated in greater detail in the accompanying drawings and described below by way of examples of the invention. In the drawings:

FIG. 1 is a satellite system having spot beam transmissions;
FIG. 3 is a block diagram of the object based application of the present invention;
and
FIG. 4 is a flow chart of the method of the present invention.

DETAILED DESCRIPTION OF PREFERRED EMBODIMENTS

Figure 2:
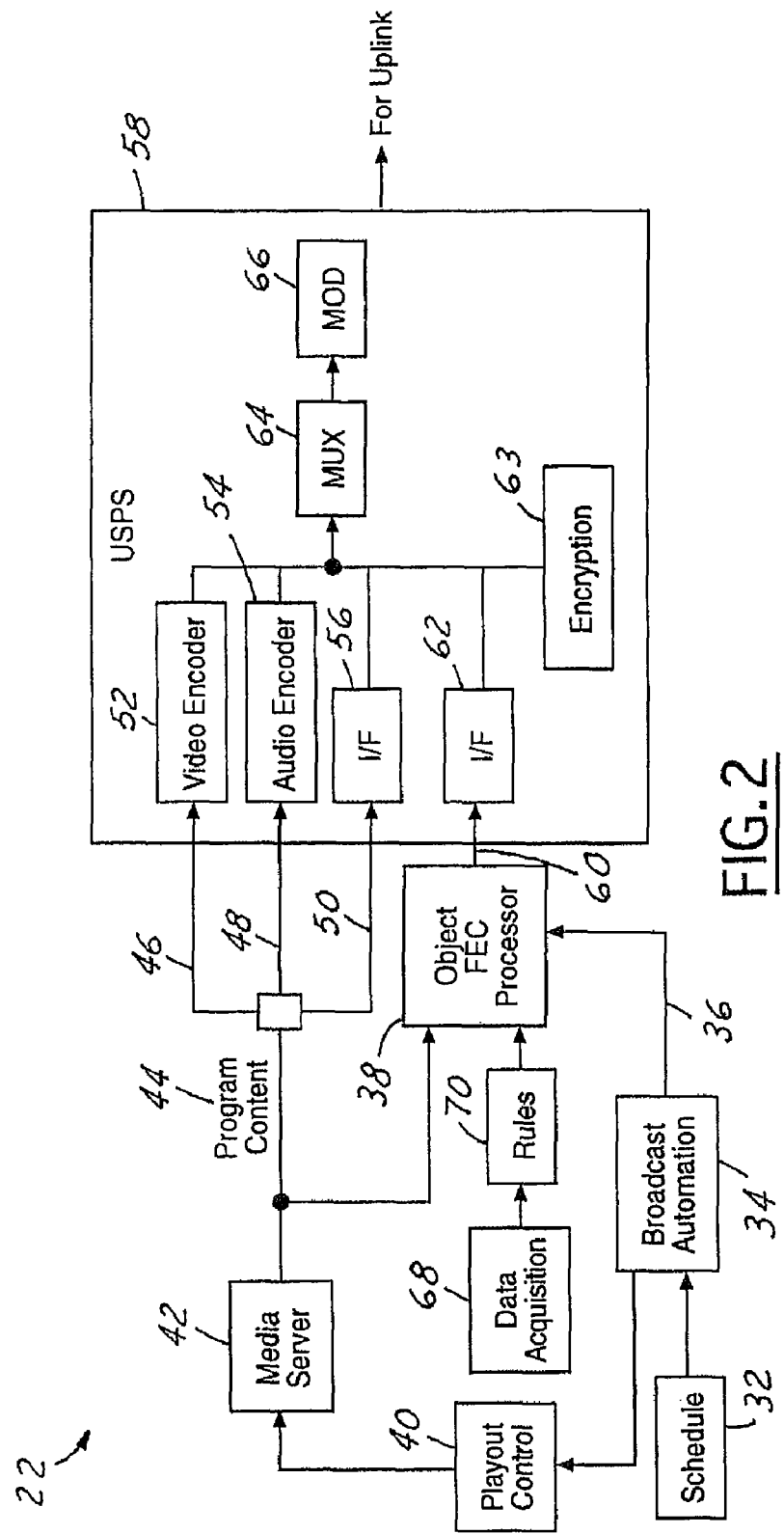
FIG. 2 is a block diagram of a broadcasting system of the present invention.

The present invention presents a method for optimizing bandwidth used for error correction by taking into account expected interferences when scheduling and applying forward error correction to data transmissions. The present invention is described herein with reference to a satellite broadcast system having spot beam transmissions to remote sites. It should be noted however, that the present invention is applicable to systems not shown in FIG. 1 and one skilled in the art is capable of applying the present invention without departing from the scope of the claims hereinafter.

FIG. 1 is a typical spot beam satellite system 10 wherein at least one satellite 12 transmits spot beams 14 to a plurality of remote sites 16. Each site has customer locations each having integrated receiver/decoders 18 that receive the satellite transmissions and decode the transmissions, typically for television 20 viewing. It should be noted that for clarity in the figure, only one customer location is shown in FIG. 1, but typically there are several customers within each spot beam remote site 16. The satellite 12 accepts signals for transmission from a central broadcasting site 22. The spot beams 14 are each directed to a particular remote site 16, each being in its own specific geographic region. The spot beams 14 shown do not overlap but it should be noted that they may or may not overlap in practice depending on the design of the satellite system.

Referring now to FIG. 2 there is shown the scheduling, error correction, and signal processing that takes place at the broadcast facility 22 in preparing the signals for satellite transmission to the remote sites according to the present invention. A master scheduler 32 provides a programming schedule to a broadcast automation system 34. The broadcast automation system 34 executes the schedule and forwards process control information 36 to an object FEC processor 38. The schedule provided by the scheduler 32 is also used by the broadcast automation system 34 to send a playout control 40 to a media server 42. The media server 42 outputs program content 44 in video data 46, audio data 48 and interactive data 50. The data components 46, 48, 50 are sent to respective encoders 52, 54 and data interface 56 in an uplink signal processing system 58 (USPS). The program content 44 is also provided to the object FEC processor 38. The value of the program content depends on the priority assigned by the broadcast facility and is one of many factors used by the present invention in determining the bandwidth to be used for error correction. The higher the priority of the data, the more bandwidth will be assigned for error correction to ensure the data is broadcast properly.

Output 60 of the object FEC processor 38 is provided to a data interface 62 in the USPS 58 and an FEC data object 60 is created. The data streams 46, 48, 50, 60 are processed, along with other data content that may be either necessary or desired. The processed signals are encrypted 63 and sent to a multiplexer 64. A modulator 66 prepares the multiplexed signal for uplink to a satellite system such as the one shown in FIG. 1.

The broadcast system 22 allows for services to provide a set of business rules for broadcast and client parameters. The business rules include, but are not limited to the amount, if any, of forward error correction that is applied to the data. The parameters themselves may change over time. Therefore, the present invention uses feedback from dynamic sources of input to adapt object broadcast and maximize the competing goals of bandwidth utilization and probability of reception.

According to the present invention, the error correction applied to content broadcast over a satellite network may be varied adaptively based on any number of active parameters and can be tailored to discrete schedule items or objects of the broadcast. An active parameter is a dynamic parameter. In other words, a parameter that is always changing. For example, time of day, bit rate, atmospheric interference, and the value, or priority, of the broadcast content are all active parameters that can target specific items in a signal containing multiple items. The present invention also uses static parameters, or parameters that are not constantly changing, such as the spot beam region. The broadcast system 22 considers a set of inputs in order to maximize the efficiency of the satellite bandwidth. The inputs include feedback from the dynamic parameters along with the data from the static parameters. The data, both static and dynamic is collected by the preset invention and used in order to apply forward error correction to each data object.

Referring still to FIG. 2, data is acquired 68 from the various sources that affect the error correction parameters used in the forward error correction algorithms. This data 68 is applied to one or more sets of rules 70 that are used by the FEC object processor in applying error correction to the targeted schedule item. The present invention uses the data in the set of rules to adapt the error correction on an object broadcast basis. As described above, the set of parameters may change over time. For instance, a high-value object that is broadcast more than once may increase the amount of FEC as it nears the end of the carousel cycle to improve the likelihood of reception. Also, the same object broadcast from different spot beams would use different rules to optimize for local conditions, such as weather patterns or current weather conditions, of the geographic region a particular spot beam is directed to.

The schedule contains information on the specific broadcast content for a specific region and that schedule is communicated to the object FEC processor where the applicable set of rules is applied in order to determine the necessary error correction.

FIG. 3 shows a schematic representation of functional blocks of an adaptive FEC system of the present invention. Like reference numbers in FIGS. 2 and 3 represent like elements in the figures. Referring to FIG. 3, the national broadcast 80 and each local-into-local broadcast block, 82(1) to 82(n), has its own independent set of FEC rules, 70, 70(1) to 70(n). These rules are fed into the FEC object processor 38 to maximize the utilization of the available bandwidth. Further, the FEC rules 70, 70(1), to 70(n) are updated by the data acquisition system 68. This further enhances the localized optimization of the present invention.

The present invention provides several advantages over known methods of error correction. The bandwidth used for error correction is optimized to account for expected interferences. For example, if there are substantially shorter outages from rain during late night hours, less error correction is applied relative to the afternoon when rain storms are more prevalent and last longer.

Another advantage of the present invention is that the bandwidth used for error correction can be applied judiciously based on a predetermined value of the broadcast content and the priority of the need to receive the content the first time it is broadcast. For example, data that must be received during the first time it is broadcast would require more error correction than data that has a lower priority and whose broadcast can be delayed or rebroadcast.

In yet another advantage of the present invention local optimizations may be applied in the case of spot-beam satellite broadcasts. Each spot corresponds to a particular geographic region. Therefore, different input parameters may be used for each region, further maximizing efficiency.

FIG. 4 is a flow chart of the method 100 of adaptive error correction according to the present invention. Adaptive data and parameter information is collected 102 by a data acquisition system. The data and parameters may include, but are not limited to, time of day, targeted region, bit rate, average or worst case atmospheric interference, the value of the program content, the number of expected broadcasts of the program content, among others too numerous to mention herein. The data acquisition may also be dependent upon a particular region associated with a particular spot beam in a spot beam satellite system. Therefore, with the present invention, it is possible to tailor the atmospheric interference expectations, as well as program content, etc. based on the particular region being broadcast to by a particular spot beam.

The acquired data is used 104 by a set of FEC rules that are also tailored to a particular region, either national or one of several local regions. The rules are used to determine the weight to apply to each variable in the applicable FEC algorithm. This allows customization of the error correction applied to each object being broadcast on an individual basis.

According to the present invention, there are multiple FEC algorithms that apply to each spot beam and/or object. Therefore, it is possible to customize the error correction on an object basis 106 according to many specific details regarding the broadcast. The error correction can be applied on an as-needed basis as opposed to being blindly applied on an overly cautious basis as was previously done in prior art methods. The corrected data is then prepared for uplink 108 to the satellite system. The present invention is advantageous in that bandwidth is utilized more efficiently as it is free from being used by excess error correction.

The invention covers all alternatives, modifications, and equivalents, as may be included within the spirit and scope of the appended claims.

What is claimed is:

1. A method of transmitting a plurality of data objects by a satellite broadcast system generating a plurality of spot beams, comprising the steps of:
   determining, on a data object by data object basis and for each spot beam transmitting each object, an amount of forward error correction to apply to each of the data objects according to a priority value associated with each data object, wherein the data object is one of a plurality of data objects each having a priority value associated therewith;
   applying the determined amount of forward error correction on a data object by data object basis to each of the plurality of data objects; and
   multiplexing the plurality of data objects having the applied forward error correction; and
   transmitting the multiplexed plurality of data objects;
   wherein:
      the satellite broadcast system transmits a national broadcast of the data objects and a plurality of local broadcasts of the data objects; and
      the method further comprises the step of applying error-correction rules for the national broadcast of the data objects and the local broadcasts of the data objects, wherein the national broadcast of the data objects and each of the local broadcasts of the data objects has its own independent set of error correction rules for the applied amount of forward error correction.

2. The method of claim 1, wherein:
   at least one of the data objects is transmitted by two spot beams of the satellite broadcast system;
   the amount of forward error correction to be applied to the at least one of the media programs is further determined according to a local condition of each of the two spot beams;
   the step of applying the determined amount of forward error correction comprises the step of:
      applying a first forward error correction for the at least one data object transmitted by a first spot beam of the two spot beams; and
      applying a second forward error correction for the at least one data object transmitted by a second spot beam of the two spot beams;
   transmitting the data object having the first forward error correction via the first spot beam of the two spot beams; and
   transmitting the data object having the second forward error correction via the second spot beam of the two spot beams.

3. The method of claim 1, wherein:
   the method further comprises the steps of acquiring data regarding parameters that may affect the transmission of the data objects via the satellite broadcast system; and
   wherein the determined amount of forward error correction is further determined based on the acquired data.

4. The method of claim 1, wherein the data object is broadcast more than once and according to a carousel cycle and the amount of forward error correction is further determined according to the carousel cycle.

5. A method for customizing error correction being independently applied to individual broadcast objects in a signal for uplink to a spot-beam satellite system transmitting a plurality of spot beams, comprising the steps of:
   assigning a priority value to the broadcast objects to be broadcast by said spot-beam satellite system;
   collecting data supplied by a plurality of sources for parameters that may affect the transmission of the individual broadcast objects via the plurality of spot beams;
   applying the parameters to a plurality of rule sets, each of said rule sets corresponding to an individual broadcast object and at least one of the plurality of spot beams;
   determining an error correction factor for each of the individual broadcast objects based on said priority value of the broadcast object and also said rule sets with said parameters data applied thereto; and
   assigning bandwidth for error correction to be independently applied to each said broadcast object based on said determined error correction factor; and
   adapting said bandwidth on a broadcast object by broadcast object basis.

6. The method of claim 5, wherein said plurality of sources supplying data for collection is selected from the list consisting of a geographic region, a weather pattern, current weather conditions, expected weather conditions, time of day, said priority value of said program content, average atmospheric interference, worst case atmospheric interference, and number of times said program content is to be broadcast.

7. The method of claim 5, wherein the broadcast object is broadcast more than once and according to a carousel cycle, and the amount of error correction is further determined according to the carousel cycle.

8. An apparatus for transmitting a plurality of data objects by a satellite broadcast system generating a plurality of spot beams, comprising:
   an data object processor for determining, on a data object by data object basis and for each spot beam transmitting each object, an amount of forward error correction to apply to each of the data objects according to a priority value associated with each data object, wherein the data object is one of a plurality of data objects each having a priority value associated therewith;
   an uplink signal processing system for applying the determined amount of forward error correction on an data object by data object basis to each of the plurality of data objects;
   a multiplexer, for multiplexing the plurality of data objects having the applied forward error correction; and
   a transmitter, for transmitting the multiplexed plurality of data objects;
   wherein:
      the satellite broadcast system transmits a national broadcast of the data objects and a plurality of local broadcasts of the data objects; and
      the data object processor further applies error-correction rules for the national broadcast of the data objects and the local broadcasts of the data objects, wherein the national broadcast of the data objects and each of the local broadcasts of the data objects has its own independent set of error correction rules.

9. The apparatus of claim 8, wherein:
   at least one of the data objects is transmitted by two spot beams of the satellite broadcast system;
   the amount of forward error correction to be applied to the at least one of the media programs is further determined according to a local condition of each of the two spot beams;
   the uplink signal processor applies a first forward error correction for the at least one data object transmitted by a first of the two spot beams and applies a second forward error correction for the at least one data object transmitted by the second of the two spot beams; and the transmitter transmits the data object having the first forward error correction via the first of the two spot beams and transmits the data object having the second forward error correction via the second of the two spot beams.

10. The apparatus of claim 8, wherein:

the apparatus further comprises a data acquisition system for acquiring data on parameters that may affect the transmission of the data objects via the satellite broadcast system; and wherein the determined amount of forward error correction is further determined based on the acquired parameters.

11. The apparatus of claim 8, wherein the data object is broadcast more than once and according to a carousel cycle, and the amount of forward error correction is further determined according to the carousel cycle.

12. An apparatus for customizing error correction being independently applied to individual broadcast objects in a signal for uplink to a spot-beam satellite system transmitting a plurality of spot beams, comprising:

a rules module for assigning a priority value to the broadcast objects to be broadcast by said spot-beam satellite system;

a data acquisition module for collecting data supplied by a plurality of sources for parameters that may affect the transmission of the individual broadcast objects via the plurality of spot beams; and an object data processor for applying the parameters to a plurality of rule sets, each of said rule sets corresponding to an individual broadcast object and at least one of the plurality of spot beams, for determining an error correction factor for each of the individual broadcast objects based on said priority value of the broadcast objects and also said rule sets with said parameters data applied thereto, and for assigning bandwidth for error correction to be independently applied to each said broadcast object based on said determined error correction factor;

wherein said object data processor adapts said bandwidth on a broadcast object by broadcast object basis.

13. The apparatus of claim 12, wherein said plurality of sources supplying data for collection is selected from the list consisting of a geographic region, a weather pattern, current weather conditions, expected weather conditions, time of day, said priority value of said program content, average atmospheric interference, worst case atmospheric interference, and number of times said program content is to be broadcast.

14. The apparatus of claim 12, wherein the broadcast object is broadcast more than once and according to a carousel cycle, and the amount of error correction is further determined according to the carousel cycle.

15. The apparatus of claim 12, wherein the satellite broadcast system transmits a national broadcast of the data objects and a plurality of local broadcasts of the data objects; and the object data processor further applies a set of error-correction rules for the national broadcast of the data objects and the local broadcasts of the data objects independently wherein the national broadcast of the data objects and the local broadcasts of the data objects has its own set of rules to an error-correction factor.

* * * * *